(12) United States Patent
Vinet et al.

(10) Patent No.: US 8,021,934 B2
(45) Date of Patent: Sep. 20, 2011

(54) METHOD FOR MAKING A TRANSISTOR WITH METALLIC SOURCE AND DRAIN

(75) Inventors: Maud Vinet, Rives (FR); Thierry Poiroux, Voreppe (FR); Bernard Previtali, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 251 days.

(21) Appl. No.: 12/433,209

(22) Filed: Apr. 30, 2009

(65) Prior Publication Data

US 2009/0286363 A1    Nov. 19, 2009

(30) Foreign Application Priority Data

May 13, 2008    (FR) .................................... 08 53084

(51) Int. Cl.
*H01L 21/8232* (2006.01)
(52) U.S. Cl. ........ 438/142; 438/135; 438/151; 438/197; 438/211; 257/E21.165; 257/E21.439
(58) Field of Classification Search .................. 438/135, 438/142, 151, 153, 154, 197, 211; 257/377, 257/382, E21.165, E21.439
See application file for complete search history.

(56) References Cited

U.S. PATENT DOCUMENTS

| 2003/0045039 A1 | 3/2003 | Shin et al. |
| 2006/0038229 A1 | 2/2006 | Tsuchiya et al. |
| 2009/0011562 A1 | 1/2009 | Licitra et al. |

FOREIGN PATENT DOCUMENTS

| WO | WO 01/71818 A1 | 9/2001 |
| WO | WO 01/95383 A1 | 12/2001 |
| WO | WO 2005/008744 A2 | 1/2005 |
| WO | WO 2007/060641 A1 | 5/2007 |

OTHER PUBLICATIONS

A. Kinoshita, et al., "Solution for High-Performance Schottky-Source/Drain MOSFETs: Schottky Barrier Height Engineering with Dopant Segregation Technique", Symposium on VLSI Technology Digest of Technical Papers, 2004, pp. 168-169.
U.S. Appl. No. 12/796,282, filed Jun. 8, 2010, Previtali, et al.

*Primary Examiner* — Thanh V Pham
(74) *Attorney, Agent, or Firm* — Oblon, Spivak, McClelland, Maier & Neustadt, L.L.P.

(57) ABSTRACT

A method including: making a structure on a substrate, said structure comprising at least a portion of a semiconductor material forming a channel of a field effect transistor, a gate located on the channel; forming at least one dielectric portion completely covering said structure and zones of the substrate corresponding to locations of a source and a drain of the field effect transistor; making two holes in the dielectric portion on each side of said structure, such that the locations of the source and the drain form bottom walls of the two holes and sides of the channel are exposed; depositing a first metallic layer on at least the bottom walls of the two holes, at least covering said sides of the channel; and depositing a second metallic layer on the first metallic layer-to form the source and the drain of the field effect transistor.

7 Claims, 5 Drawing Sheets

METHOD FOR MAKING A TRANSISTOR WITH METALLIC SOURCE AND DRAIN

TECHNICAL FIELD

The invention relates to a method for making a field effect transistor, for example a MOS (Metal Oxide Semiconductor) transistor, comprising a source and drain that are metallic or based on at least one metal and a metal/semiconductor alloy. The invention is also applicable for making double gate transistors.

STATE OF PRIOR ART

One known method for making a MOS with metallic source and drain is firstly to make a classical MOS transistor comprising a source, a channel and a drain formed in an active layer of an SOI (semiconductor on insulator) substrate, a gate and spacers formed around the gate. A metallic layer is then deposited over the entire surface of the wafer (or substrate), thus fully covering the transistor. The next step is annealing to form portions of a metal/semiconductor alloy called a silicide when the semiconductor is made of silicon, at zones comprising a direct contact between the semiconductor in the active layer and the deposited metal.

However, such a method requires a selective removal of the metal that does not react with the semiconductor after the silicide zones have been made, to prevent short circuits at the transistor (for example between the drain and the source) and with other transistors present on the substrate. For example, if the metal used is cobalt, selective removal is done using a chemical solution based on $NH_4OH/H_2O_2/H_2O$. The need to make this selective removal restricts the choice of metals that can be used to form the metal/semiconductor alloy because this metal must have properties so that it can be removed selectively with respect to other materials in the transistor.

Furthermore, penetration of silicide into the active layer is very sensitive to dispersion on the initial thickness of the active layer of silicon, these dispersions then occurring in portions of silicide made and inducing strong dispersions on the characteristics of the transistors thus made.

In document WO 01/95383, siliciding is done at the source and the drain of the transistor starting from a first metallic layer deposited on the transistor, then a second metallic layer is deposited over the entire surface of the wafer so that electrical contacts of the source and the drain can be made later. At this stage of the method, all transistors present on the wafer are internally short circuited (contact between the source and the drain through metallic layers passing above the gate and on the source and the drain) and short circuited to each other. Chemical Mechanical Polishing (CMP) is done to eliminate the internal short circuit, with a stop on a hard mask present on the transistor gate, thus eliminating portions of metallic layers electrically connecting the source and the drain. The short circuit between transistors is eliminated by etching portions of metallic layers located outside the active region.

Considering that the metallic layers are etched (to eliminate short circuits between transistors) after the CMP step, there is then a constraint on the nature of the metals in these metallic layers because it must be possible to etch them selectively with respect to the other materials present, for example the hard mask present on the gate that is based on $SiO_2$ or $Si_3N_4$, or the gate material. For example, it is impossible to use tungsten to make the second metallic layer, although tungsten is a suitable material to make this second metallic layer due to its low resistivity and good compatibility with silicon, because it can be chemically etched from a chloride or fluoride solution that also etches oxides. Therefore, such etching could damage gate spacers that are not protected during this etching.

If metallic layers are etched before the CMP step, the thickness of the second metallic layer will not be constant over the entire wafer. In particular it is greater when passing steps, in other words around the periphery of the gates, which can result in the formation of metallic spacers around some gates that can maintain the existing source/drain short circuit after the etching step has been done.

Document WO 01/71818 A1 describes a method for making a MOS transistor in which the sidewalls of the transistor channel are silicided starting from a first metallic layer deposited on the transistor. A second metallic layer is then deposited over the entire surface of the wafer to make the transistor source and drain.

Once again, this method necessarily means that the short circuit should be eliminated between the transistors by etching of portions of metallic layers located outside the active region, causing the same problems as were previously presented for document WO 01/95383.

PRESENTATION OF THE INVENTION

One purpose of this invention is to propose an inexpensive method for making a transistor with metallic source and drain comprising a small number of steps and not requiring implementation of selective etching of metal after the production of portions of the metal/semiconductor alloy in contact with the channel.

To do this, one embodiment proposes a method, or a process, for making a field effect transistor comprising at least the following steps:

a) make a structure, on a substrate, comprising at least a portion of a semiconductor material forming a channel of the transistor, a gate located on the channel and a hard mask located on the gate, b) formation of at least one dielectric portion completely covering said structure and zones of the substrate corresponding to locations of a source and a drain of the transistor and a peripheral zone at said locations, and comprising an approximately plane face opposite a face in contact with the substrate, c) in the dielectric portion, make two holes with one on each side of said structure, such that the locations of the source and drain form the bottom walls of the holes and the sidewalls of the semiconductor material portion, that is the sides of the channel, are exposed, d) deposit a first metallic layer at least on the walls of the holes, covering at least said sidewalls of the channel, e) silicide said sidewalls of the channel, f) deposit a second metallic layer on the first metallic layer, forming the source and drain of the transistor in conjunction with the previously silicided portions, g) chemical mechanical polishing of the second metallic layer with a stop on the hard mask.

The source and drain of the transistor obtained by use of this method comprise portions based on an alloy between the material used to make the channel, for example silicon, germanium or a silicon-germanium alloy, and a metal. Such an alloy is called a silicide when it is an alloy between silicon and a metal, a germanide when it is an alloy between germanium and a metal, and a silicide-germanide when it is an alloy between silicon-germanium and a metal. The term "silicide" will be used throughout the remainder of this document to denote any alloy of a semiconductor and a metal.

In particular, such a transistor structure has the advantage that it reduces the access resistance to the source and drain of the transistor because the method does not impose any restriction on the choice of the metal(s) used to form portions of the silicide and the source and drain of the transistor. This is particularly advantageous when the metal that did not react with the semiconductor to form the silicide is very slightly resistive relative to the metal used to form the remainder of the transistor source and drain.

When the channel is based on a P-doped semiconductor, the first metallic layer may preferably be based on platinum and/or iridium. When the channel is based on a N-doped semiconductor, the first metallic layer may preferably be based of erbium and/or ytterbium or nickel. In general, the first metallic layer may be based on platinum and/or nickel and/or erbium and/or ytterbium and/or cobalt and/or titanium and/or iridium.

The use of such metals has advantages compared with a dual layer composed of tungsten and TiN used in processes according to prior art. TiN, that is in contact with the silicide, forms a barrier layer against tungsten and is highly resistive (the electrical resistance $\rho$ is equal to about $2000 \times 10^{-9}$ $\Omega \cdot m$) compared with other metals, for example platinum ($\rho = 94 \times 10^{-9}$ $\Omega \cdot m$) or nickel ($\rho = 70 \times 10^{-9}$ $\Omega \cdot m$). The current output by the transistor can thus be increased.

This transistor manufacturing method can be used to make a transistor with metallic source and drain with any metal, particularly metals that cannot be etched and/or silicides that cannot be removed selectively relative to the residual metal that did not react with the semiconductor to form the silicide.

The invention is equally applicable for single gate transistors and for double gate transistors. The invention is also applicable to make High Performance (HP) transistors.

Finally, this method is compatible with the production of transistors comprising different channel materials (for example Si and Ge) on the same substrate, without depending on chemistry for the selective removal of the first metallic layer common to the transistors.

The portion of a semiconductor material may be a portion of a semiconductor surface layer of the SOI type substrate and the source and drain locations may be zones of a dielectric layer of the SOI substrate exposed by etching of the semiconductor surface layer.

The dielectric portion in step b) may be formed by use of the following steps:

deposit a first dielectric layer completely covering said structure and the source and drain locations of the transistor and the peripheral zone, deposit a second dielectric layer on the first dielectric layer, chemical mechanical polishing of the second dielectric layer, with a stop on the first dielectric layer.

The two holes in step c) may be made by lithography and etching of portions of the second dielectric layer that are at or above the locations of the source and drain, and a withdrawal of portions of the first dielectric layer not covered by portions remaining from the second dielectric layer.

The two holes in step c) may be made by lithography and etching of zones of the dielectric portion covering the locations of the source and the drain.

In step d), the metallic layer may also be deposited on the structure and on the dielectric portion, at the peripheral zone.

The method may also include a step to deposit a layer based on titanium and/or titanium nitride and/or tungsten on the first metallic layer, between steps e) and f).

The method may also include a step to deposit an oxide layer on the second metallic layer, after step f).

BRIEF DESCRIPTION OF THE DRAWINGS

This invention will be better understood after reading the description of example embodiments given purely for information and that are in no way limitative with reference to the appended drawings in which.

Identical, similar or equivalent parts of the different figures described below have the same numeric references to facilitate cross references between one figure and another.

The different parts shown in the figures are not necessarily all shown at the same scale, to make the figures more easily understandable.

The various possibilities (variants and embodiments) must be understood as not being exclusive of each other and may be combined together.

DETAILED PRESENTATION OF PARTICULAR EMBODIMENTS

Refer to FIGS. 1A to 1I that show steps in a method for making a MOS transistor 100 with a metallic source and drain according to one particular embodiment.

In this embodiment, the transistor 100 is made from an SOI substrate. In one variant, the transistor 100 may be made from a bulk substrate based on a semiconductor, for example based on silicon, or from a germanium on insulator type substrate or a compound based on silicon and germanium on insulator.

Figure 1A:
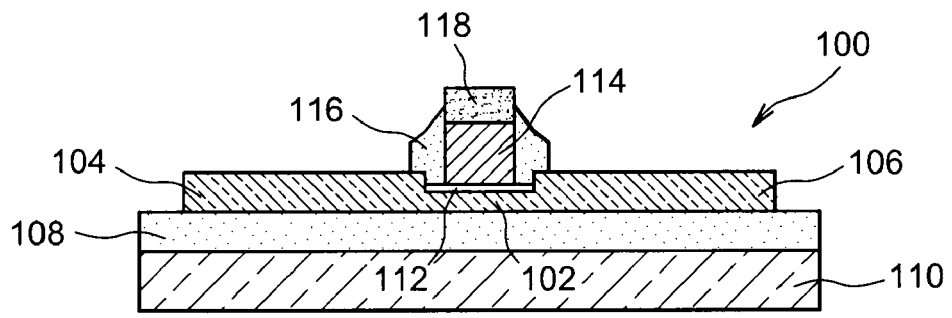
FIGS. 1A to 1I show the steps in a method for making a transistor with a metallic source and drain according to a particular embodiment of this invention.

As shown in FIG. 1A, the first step is to apply standard steps for production of a MOS transistor starting from an SOI substrate. A channel 102 and portions 104 and 106 corresponding to the locations of the source and drain of the transistor 100 respectively, are defined particularly in an active layer that may be thin and preferably based on silicon and/or germanium of an SOI type substrate. This active layer is deposited above a dielectric layer 108, for example based on $SiO_2$, and a bulk layer 110 based on a semiconductor such as silicon.

The transistor 100 also comprises a gate dielectric 112 that may be based on a dielectric material with high permittivity ("High-K", in other words with a dielectric constant greater than or equal to 4) such as $HfO_2$, a gate 114, for example based on doped polysilicon and/or metal, and spacers 116 formed on the sides of the gate 114. These spacers 116 may for example comprise a first layer of $SiO_2$ and a second layer of SiN.

The transistor 100 also comprises a hard mask 118 formed above the gate 114. This hard mask 118 may be based on an oxide or a semiconductor nitride, or it may be formed by a dual layer composed of an oxide and semiconductor nitride, for example an $SiO_2/Si_3N_4$ dual layer. The role of this hard mask 118 will be described later.

The active zones and the gate of the transistor 100 may be made by lithography and etching. After the gate has been defined, LLD ("Light Doped Drain") and LDS ("Light Doped Source") implantations (not shown) may be made to form extension zones under the gate 114, possibly preceded by manufacturing of a spacer and selective epitaxy intended to increase the thickness of the silicon that is no located under the gate 114. These implantations can then be thermally activated by annealing.

Figure 1B:
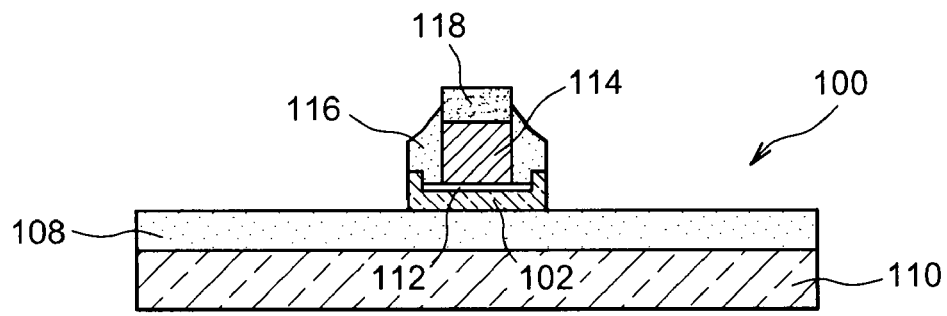

As shown in FIG. 1B, the next step is to etch the portions 104 and 106 of the active layer selectively with respect to spacers 116 and the hard mask 118. When the active layer is based on silicon, this etching may for example be done using a plasma etching starting from HBr and under an He/$O_2$ atmosphere at high pressure (for example 65 mTorr). A structure formed by the channel 102, the gate dielectric 112, the gate 114, spacers 116 and the hard mask 118 are obtained on the substrate.

The next step is to deposit a layer 120, for example based on a semiconductor nitride such as SiN, in a conform manner on the previously described structure and on the dielectric layer 108. This layer 120 may for example be deposited by CVD (chemical vapour deposition).

Figure 1C:
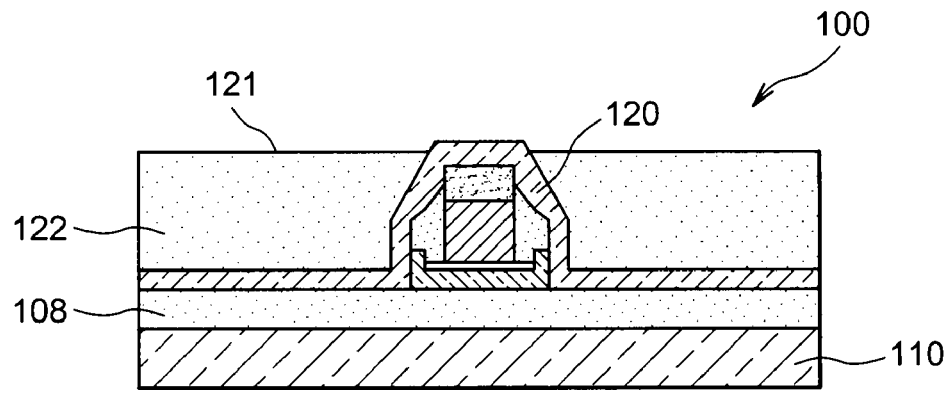

After the layer 120 has been deposited, a dielectric layer 122 is deposited, for example based on $SiO_2$, and that can be obtained by an HDP (high density plasma) type deposit starting from a silane type chemical compound (FIG. 1C). The material in the dielectric layer 122 is preferably chosen such that it can be easily polished. The next step is a CMP of this layer 122 with a stop on the layer 120 (on the portion of the layer 120 above the hard mask 118). The result is a dielectric portion covering all elements made on the substrate and having an approximately plane face 121 opposite a face located on the side of the dielectric layer 108.

The layer 120 will also be used in the remaining part of the method as a stop layer during subsequent etching (that will be described with reference to FIG. 1E). Therefore the choice of the thickness of the layer 120 depends on the selectivity of the etching that will be done later and for which the layer 120 will be used as a stop layer, and the selectivity of the CMP for the previously made layer 122. The stop layer 120 may for example be between about 10 nm and 50 nm thick, and for example equal to about 50 nm.

Figure 1D:
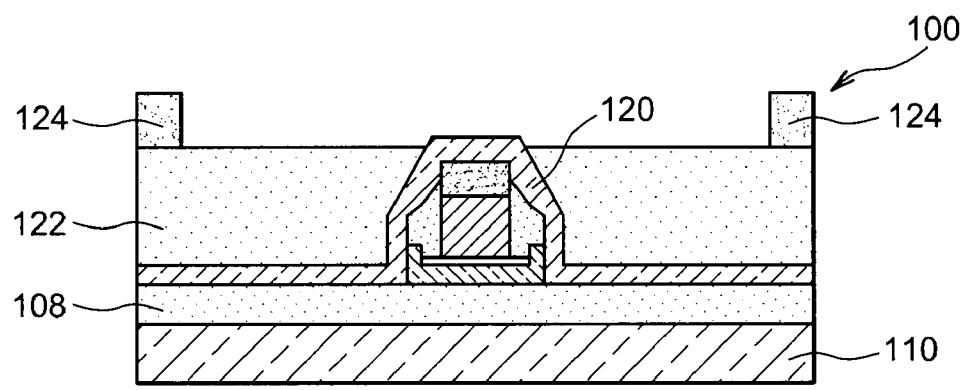

As shown in FIG. 1D, a mask 124, for example based on resin, is deposited delimiting the locations of the source and drain of the transistor 100 that will be made in the remainder of the method on the dielectric layer 108. The next step is insolation of the dielectric layer 122 at zones not covered by the mask 124, by electron beam or photolithography.

Figure 1E:
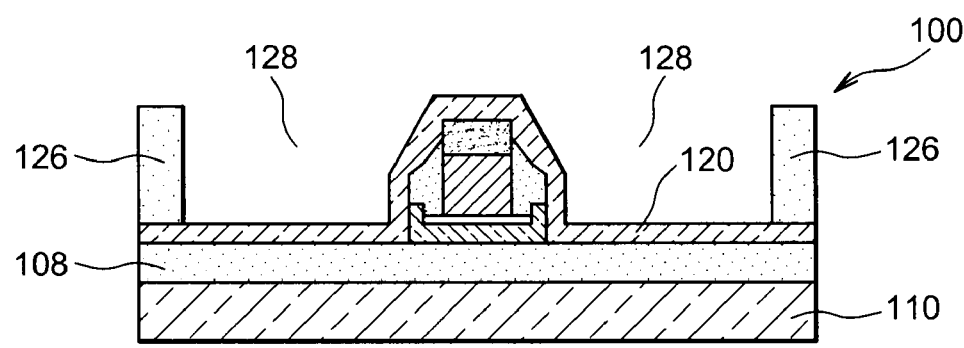

The next step is etching of the dielectric layer 122 with a stop on the layer 120 (FIG. 1E). The portions of the layer 122 at the locations on which the source and drain of the transistor 100 will be made (and corresponding to the locations of the old portions 104 and 106 shown in FIG. 1A) are therefore eliminated, forming holes 128 above these locations, between the remaining portions 126 of the dielectric layer 122 arranged at a peripheral zone corresponding to the insulation zones of the transistor 100. This etching may for example be plasma etching or a combination of plasma etching and wet chemical etching, for example using a BOE80:1 type solution. The resin mask 124 is then removed.

Figure 1F:
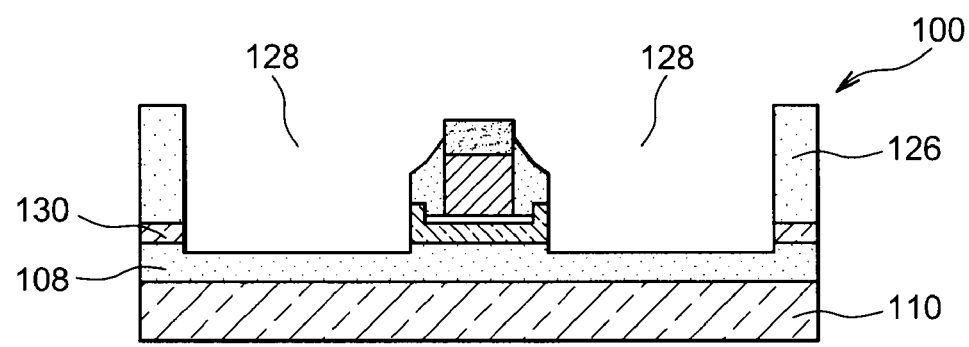

As shown in FIG. 1F, portions of the stop layer 120 located on the structure (channel+gate+gate dielectric+hard mask+ spacers) previously made on the substrate and at the bottom of the holes 128 are then eliminated, for example by etching combining an $O_2$ plasma and an SC1 ("standard clean 1"), in other words a mix of ammonia, oxygenated water and water) chemical type solution. The remaining portions 130 of the stop layer 120 located under the remaining portions 126 of the layer 122 at the transistor insulation zones, are kept. Thus, holes 128 are obtained comprising bottom walls formed by the locations of the source and drain of the transistor 100. The sides of the channel 102 that will come into contact with the source and drain of the transistor 100 are also exposed, by eliminating the layer 120.

Figure 1G:
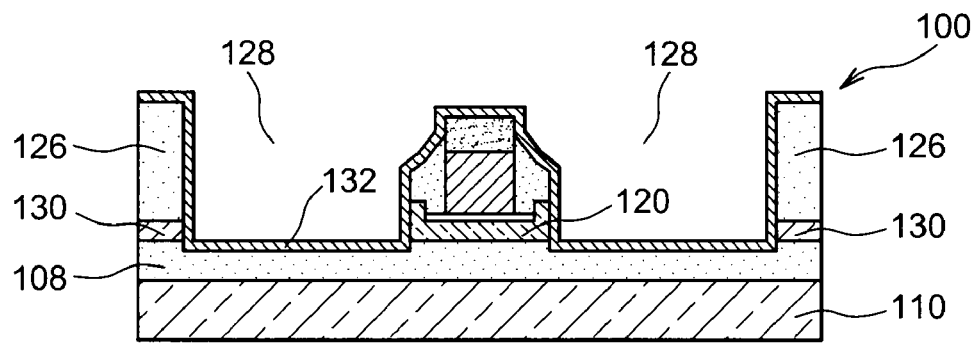
Figure 1H:
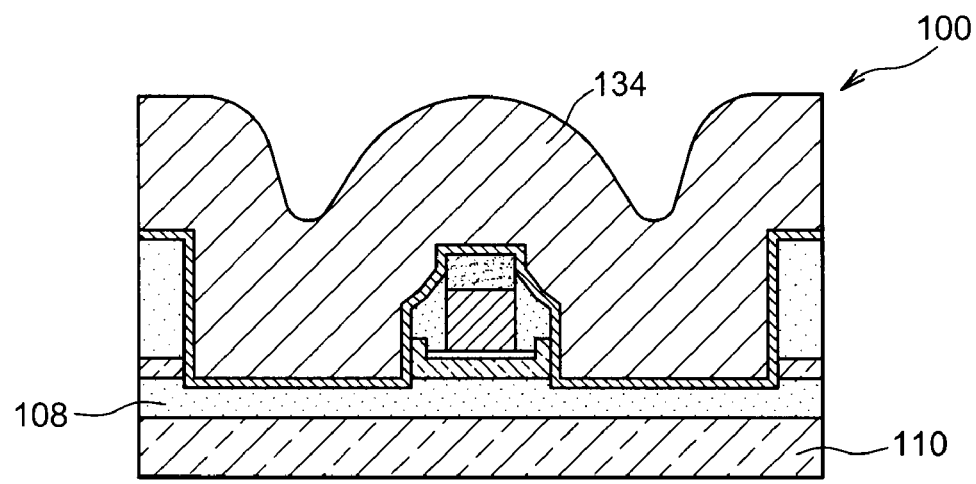

The next step is to deposit a first metallic layer 132 in a conform manner on the entire transistor 100, and particularly on the walls of holes 128, on the remaining dielectric portions 126, on the structure previously formed on the substrate and on the sides of the previously exposed channel 102 (FIG. 1G). The metal in this layer 132 will form an alloy with the semiconductor of the channel 102. In particular, this first metallic layer 132 may be based on:

iridium and/or platinum in the case of a PMOS type transistor 100 with a silicon channel 102, nickel and/or erbium and/or ytterbium in the case of an NMOS type transistor 100 with a silicon channel 102, platinum in the case of a PMOS type transistor 100 with silicon-germanium channel 102.

The choice of the metal used to form this alloy is based on several criteria: the barrier height between the metal in the layer 132 and the semiconductor in the channel 102, the ability to segregate doping agents, integrability (in other words the ability to use it in a transistor manufacturing process) etc. The metal in the layer 132 can combine with the semiconductor in the channel 102 to form a silicide and can be etched selectively or not, relative to other materials in the transistor 100.

The thickness of the first layer of metal 132 is chosen so that the sides of the previously exposed channel 102 can be silicided over a required distance, under the spacers 116. For example, a layer 132 based on platinum may be deposited by PVD (physical vapour deposition), and its thickness may be equal to about 9 nm. Such a layer 132 can give a platinum thickness equal to about 4 nm on the sides of the channel 102 and a silicide penetrating under the spacers 116 over a distance equal to about 15 nm when the thickness of the channel 102 is equal to about 10 nm. When the layer 132 is based on nickel, its thickness may be equal to about 9 nm.

The next step is siliciding annealing to form the required alloy at the channel 102 (for example annealing at a temperature equal to about 450° C., under a nitrogen atmosphere in the case of platinum based layer 132).

Furthermore, when the transistor 100 comprises extension zones (LDD/LDS) close to the channel 102, the first layer of metal 132 then forms electrical contacts based on silicide with these extension zones.

The next step is to deposit a second metallic layer 134 on the first metallic layer 132 to fill in the holes 128. This second metallic layer 134 is deposited over the entire transistor 100. The nature of the metal in this layer 134 is chosen as a function of its ability to fill the holes 128 and its low resistivity, the layer being designed to form the source and drain of the transistor 100. Advantageously, this second metallic layer 134 may be based on tungsten deposited by CVD starting from the $WF_6$ precursor, and possibly preceded by deposition of a Ti/TiN or TiN layer acting as a barrier (not shown) to the distribution of fluorine and/or followed by deposition of an oxide-based capping layer (not shown) on the second metallic layer 134 to facilitate subsequent CMP.

Figure 1I:
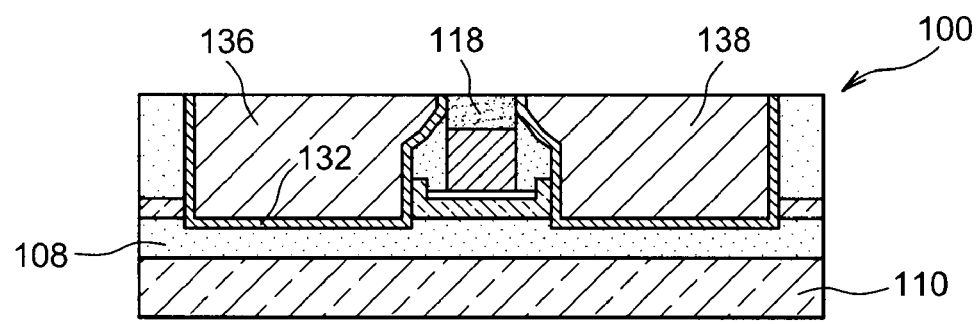

In FIG. 1I, CMP is applied to the first metal layer 132, the second metal layer 134 and possibly other layers deposited during the step described above with reference to FIG. 1H, with a stop on the hard mask 118. The result obtained is thus metallic portions 136 and 138 forming the source and drain of the transistor 100 respectively with the remaining portions of the first metallic layer 132. When an oxide-based capping layer is deposited on the second metallic layer 134 before the CMP, this capping layer limits parasite phenomena creating recesses in low zones in the second metallic layer 134 and erosion of high zones in this layer 134.

This method is particularly applicable for making CMOS transistors. For example, one or several first NMOS transistors are made comprising a first type of silicide made at channel—source and channel—drain junctions, and one or several second PMOS transistors are formed comprising another type of silicide at its junctions. This is done by successively etching holes 128 corresponding to each type of transistor. For example, the first step is etching of the holes 128 for PMOS transistors and an appropriate metal deposition (for example iridium and/or platinum) to form the first layer of metal 132 for these transistors. This is followed by a second lithography and etching, to make the holes 128 for the NMOS transistors and an appropriate metal (for example nickel) is then deposited to form the first layer of metal 132 for these transistors. The next step is siliciding annealing and finally a metal is deposited to fill in the holes 128 in all transistors (second metallic layer 134 common to the PMOS and NMOS transistors) and CMP is done to electrically isolate the transistors from each other and to electrically isolate the source and drain of each transistor.

This method for making a transistor with metallic source and drain is applicable to all field effect transistor architectures and particularly double gate transistors, provided that it is possible to etch the semiconductor thickness at the transistor source and drain zones.

Refer to FIGS. 2A to 2D showing steps in a method for making a double gate transistor 200 with metallic source and drain according to a particular embodiment, to make a double gate transistor.

In this embodiment, the transistor 200 is made from an SOI substrate. However, as for the previously described transistor 100, the transistor 200 could be made from a bulk semiconductor based substrate, for example based on silicon, or from a germanium on insulator type substrate, or an alloy based on silicon and germanium on insulator.

Figure 2A:
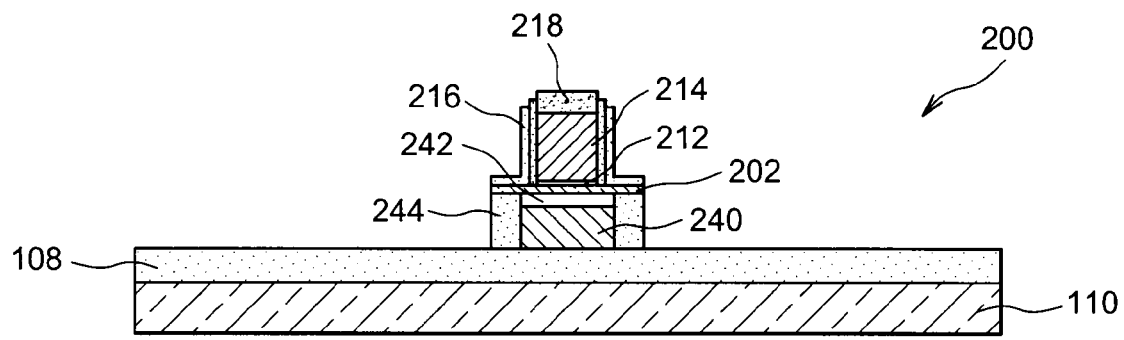
FIGS. 2A to 2D show the steps in a method for making a double gate transistor with a metallic source and drain, also according to a particular embodiment of this invention.

FIG. 2A shows that firstly, standard steps are applied for production of a double gate MOS transistor starting from an SOI substrate, for example by bonding and etching of layers so as to form a structure comprising a channel 202, two gate dielectrics 212 and 242, two gates 214 and 240, spacers 216 formed on the sides of the gate 240, spacers 244 formed on the sides of the gate 240 and a hard mask 218 formed above the gate 214, on the dielectric layer 108.

Therefore, unlike the transistor 100 described previously, it can be seen that the transistor 200 comprises an additional back gate 240, a gate dielectric 242 and spacers 244 associated with this back gate 240.

Figure 2B:
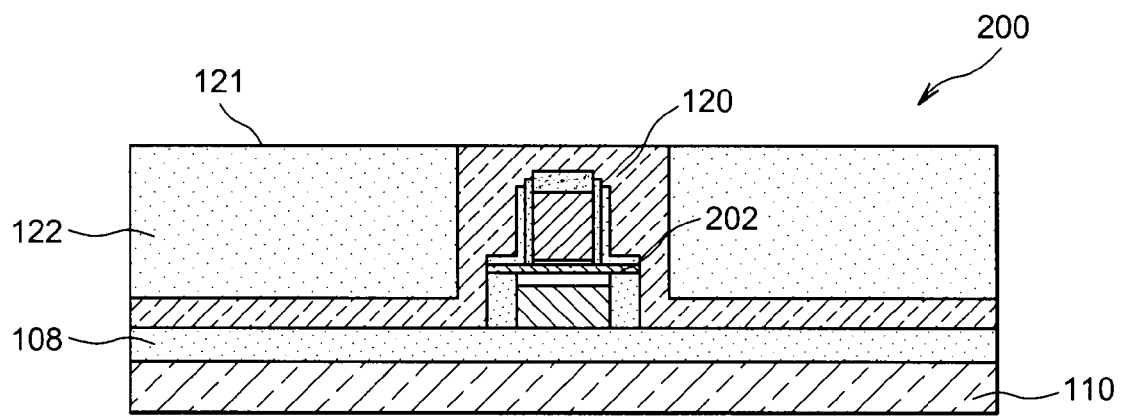

As for production of the transistor 100, the next step is to deposit the layer 120 in a conform manner on the previously described structure and on the dielectric layer 108. After deposition of the layer 120, the dielectric layer 122 is deposited (FIG. 2B). The next step is CMP on this layer 122 with a stop on layer 120 (on the portion of the layer 120 located above the hard mask 218), thus forming a dielectric portion covering all elements made on the substrate and having an approximately plane face 121 opposite a face located on the side of the dielectric layer 108.

Figure 2C:
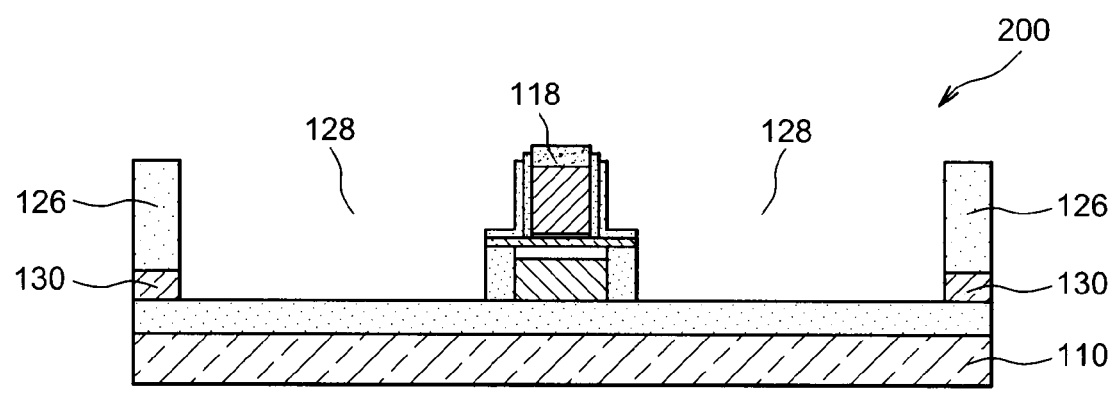

Then in a manner similar to the first embodiment, holes 128 are formed through the dielectric layers 120, 122 at the locations of the source and the drain of the transistor 200 that will be made in the remainder of the method on the dielectric layer 108. In FIG. 2C, the remaining portions 126 of the dielectric layer 122 and the remaining portions 130 of the layer 120 are arranged at a peripheral zone corresponding to the insulation zones of the transistor 200.

The result obtained is thus holes 128 comprising bottom walls formed by the locations of the source and drain of the transistor 200. Furthermore, by eliminating the layer 120, the sidewalls of the channel 202 that will be brought into contact with the source and drain of the transistor 200, are exposed.

Figure 2D:
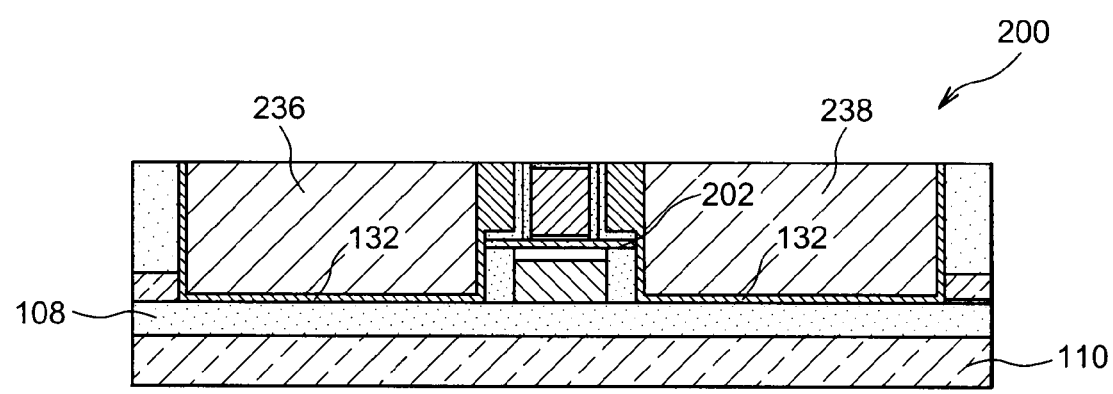

In FIG. 2D, the transistor 200 is completed by forming the metallic layer 132, metallic portions 236, 238 forming the source and drain of the transistor 200 with the remaining portions of the metallic layer 132, in a manner similar to that for the transistor 100. A siliciding annealing is done to form the required alloy at the channel 202, at the contacts with the source and drain of the transistor 200.

This method is also applicable to production of the metallic source and drain for transistors on a bulk semiconductor substrate after implantation of the LDD, LDS and production of spacers. Steps in the method to achieve this are similar to steps in the method for making transistors 100 and 200 on an SOI substrate, except for the semiconductor etching step (at the source and drain) forming the channel, with a stop on the buried oxide 108 that is replaced by etching the substrate over a thickness equivalent to the depth of the LDD and LDS junctions.

The invention claimed is:

1. A method for making a field effect transistor comprising at least the following steps:
    making a structure on a substrate, said structure comprising at least a portion of a semiconductor material forming a channel of the field effect transistor, a gate located on the channel and a hard mask located on the gate;
    forming at least one dielectric portion completely covering said structure and zones of the substrate corresponding to locations of a source and a drain of the field effect transistor and a peripheral zone at said locations, and comprising an approximately plane face opposite a face in contact with the substrate, said forming including,
        depositing a first dielectric layer fully covering said structure and locations of the source and the drain of the field effect transistor and the peripheral zone,
        depositing a second dielectric layer on the first dielectric layer, and
        chemical-mechanical polishing the second dielectric layer stopping on the first dielectric layer;
    making two holes in the dielectric portion on each side of said structure, such that the locations of the source and the drain form bottom walls of the two holes and sides of the channel are exposed;
    depositing a first metallic layer on at least the bottom walls of the two holes, at least covering said sides of the channel;
    siliciding said sides of the channel;
    depositing a second metallic layer on the first metallic layer to form the source and the drain of the field effect transistor in conjunction with the silicided sides of the channel; and
    chemical-mechanical polishing the second metallic layer stopping on the hard mask.

2. The method according to claim 1, wherein the portion of the semiconductor material forming the channel is a portion of a semiconductor surface layer of an SOI substrate and the source and drain locations are zones of a dielectric layer of the substrate exposed by etching of the semiconductor surface layer.

3. The method according to claim 1, wherein the making the two holes includes making the two holes by lithography and etching of portions of the second dielectric layer at the locations of the source and drain, and a withdrawal of portions of the first dielectric layer not covered by portions remaining from the second dielectric layer.

4. The method according to claim 1, wherein the depositing of the first metallic layer includes depositing the first metallic layer on the structure and on the dielectric portion at the peripheral zone.

5. The method according to claim 1, further including depositing a layer based on at least one of titanium, titanium nitride, tungsten on the first metallic layer, between the siliciding and the depositing of the second metallic layer.

6. The method according to claim 1, further including depositing an oxide layer on the second metallic layer after the depositing of the second metallic layer.

7. The method according to any one of the previous claims, wherein the first metallic layer is based on at least one of platinum, nickel, erbium, ytterbium, cobalt, and titanium.

* * * * *